US005709588A

United States Patent [19]
Muroyama

[11] Patent Number: 5,709,588
[45] Date of Patent: Jan. 20, 1998

[54] POLISHING SLURRY AND POLISHING PROCESS USING THE SAME

[75] Inventor: Masakazu Muroyama, Kanagawa, Japan

[73] Assignee: Sony Corporation, Tokyo, Japan

[21] Appl. No.: 709,824

[22] Filed: Sep. 10, 1996

[30] Foreign Application Priority Data

Sep. 20, 1995 [JP] Japan .................. 7-241929

[51] Int. Cl.$^6$ ................ B24B 1/00; B24B 7/19; B24B 7/30
[52] U.S. Cl. ................ 451/41; 451/28
[58] Field of Search ................ 451/41, 28, 42, 451/36, 285; 51/106, 3; 252/79.1; 216/89; 156/636.1

[56] References Cited

U.S. PATENT DOCUMENTS 3,615,739 10/1971 Varsanyi et al. .................. 106/10
5,137,541 8/1992 Foster ........................ 106/3
5,575,885 11/1996 Hirabayashi et al. .............. 156/636.1

*Primary Examiner*—James G. Smith
*Assistant Examiner*—Derris H. Banks
*Attorney, Agent, or Firm*—Ronald P. Kananen

[57] ABSTRACT

A polishing slurry used for a process of polishing a workpiece by bringing the workpiece in sliding-contact with a polishing plate supplied with the slurry, and a polishing process using the slurry. The slurry includes polishing particles treated with a surface finishing agent having at least a carboxyl group containing material, an amino group containing material, and a sulfonic acid group containing material. The slurry is effective to polish a workpiece without occurrence of scratches on the surface of the workpiece.

8 Claims, 3 Drawing Sheets

Prior Art

5,709,588

POLISHING SLURRY AND POLISHING PROCESS USING THE SAME

BACKGROUND OF THE INVENTION

The present invention relates to a polishing slurry and a polishing process using the polishing slurry.

The interconnecting technique is toward finer-line geometries and multiple levels of metallization with an increase in density of devices. However, the high integration of a device tends to degrade reliability. This is because steps of an interlayer dielectric film become larger and steeper with the trend toward finer-line geometries and multi-layer structure of interconnections, and they degrade the processing accuracy and reliability of an interconnection formed on the interlayer dielectric film. On the other hand, at the present time, the step coverage of an Al (aluminum) interconnection cannot be expected to be significantly improved, and consequently, the planarization of an interlayer dielectric film is required to be improved.

Various techniques for forming and planarizing dielectric films have been developed; however, when these techniques are applied to interconnection layers having finer-line geometries and multi-layer structure, there is an important problem in that planarization is insufficient in a region in which an interval between interconnections is wide.

Recently, there is reported a planarizing process by chemical-mechanical polishing (CMP) using fine particles of silicon oxide in a basic solution. In this polishing process, a wafer is polished by bringing a surface, on which an interlayer dielectric film is formed, of the wafer in sliding-contact with a polishing cloth stuck on a rotating table while a slurry is supplied onto the polishing cloth. The slurry generally used in this process is prepared by dispersing fine particles (particle size: about 10 nm) of a metal oxide such as silicon oxide in a potassium hydroxide solution.

The planarization process by CMP for an interlayer dielectric film will be described with reference to FIGS. 3A to 3C. As shown in FIG. 3A, a silicon oxide film 2 and an Al interconnection film 3 are formed on a silicon substrate 1, and the Al interconnection layer 3 is patterned by photolithography and reactive ion etching (RIE).

An interlayer dielectric film 4 is formed as shown in FIG. 3B, and is then planarized by removing projections thereof by CMP as shown in FIG. 3C. This process has been described, for example, in Journal of Semiconductor World (Jan, 1994) and Japanese Patent Laid-open No. Hei 6-10146.

On the other hand, another process of polishing multi-layer interconnections has been examined, in which a planarized interconnection is formed. This is known as an IBM Damascen process having steps of planarizing an interlayer dielectric film by polishing; forming, by etching, a via-contact for connecting upper and lower interconnections and trenches for the upper interconnection; and forming a metal layer thereon and removing, by polishing, the metal layer other than the via-contacts and the trenches, to thus form a buried metal interconnection. This process has been described in detail in a document identified as S. Roeht et al: PROC. IEEE Conf., 22(1992)

Chemical-mechanical polishing for an interlayer dielectric film is generally performed in a relatively basic region for producing chemical polishing effect. In this case, the dispersibility, in the basic solution, of fine particles of silicon oxide added for producing a physical polishing effect seems to be preferably maintained because the fine particles of silicon oxide have acidic surfaces. However, secondary particles of silicon oxide are sedimented during storage or the like, and thereby the concentration of silicon oxide in a slurry is changed. As a result, there is a problem in that the polishing rate is varied.

On the other hand, chemical-mechanical polishing for a metal interconnection layer is generally required to be performed in a relatively acidic region for producing chemical polishing effect. In this case, it is known that the dispersibility, in the acidic solution, of fine particles of silicon oxide added for producing a physical polishing effect is insufficient because the fine particles of silicon oxide have acidic surfaces, with a result that the fine particles tend to be aggregated.

This has been described in detail in a document identified as Journal of Surface, Vol. 23, No. 5, (1985).

Consequently, upon polishing an interconnection layer, there is a fear that damages called "scratches" occur on an interconnection layer and an interlayer dielectric film due to aggregates of fine particles of silicon oxide.

SUMMARY OF THE INVENTION

An object of the present invention is to provide a slurry having polishing particles simply surface-treated, which is capable of stably polishing an interlayer dielectric film and a metal interconnection layer while suppressing occurrence of scratches on the surfaces thereof, and a polishing process using the slurry.

To achieve the above object, according to an aspect of the present invention, there is provided a polishing slurry used for a process of polishing a workpiece by bringing the workpiece in sliding-contact with a polishing plate supplied with the slurry, the slurry including polishing particles treated with a surface finishing agent having at least a carboxyl group containing material, an amino group containing material, and a sulfonic acid group containing material.

According to another aspect of the present invention, there is provided a process of polishing a workpiece by bringing the workpiece in sliding-contact with a polishing plate supplied with a slurry, wherein the slurry includes polishing particles treated with a surface finishing agent having at least a carboxyl group containing material, an amino group containing material, and a sulfonic acid group containing material.

In the above slurry and the polishing process, the carboxyl group containing material in the surface finishing agent is preferably an hydroxycarboxylic acid; the sulfonic acid group containing material in the surface finishing agent is preferably an alkylsulfonic acid; and the amino group containing material in the surface finishing agent is preferably an alkylamine.

BRIEF DESCRIPTION OF THE DRAWINGS

FIGS. 1A to 1C are side views of a wafer in respective processing steps in Example 3, wherein FIG. 1A shows a state in which an Al interconnection layer is patterned, FIG. 1B shows a state in which a silicon oxide film is patterned, and FIG. 1C shows a state after polishing;

FIGS. 3A to 3C are side views of a wafer in respective steps of fabricating a semiconductor device according to a related art, wherein FIG. 3A shows a state in which an Al interconnection layer is patterned; FIG. 3B shows a state in which a silicon oxide film is patterned; and FIG. 3C shows a state after polishing.

DETAILED DESCRIPTION OF THE PREFERRED EMBODIMENTS

Figure 1A:
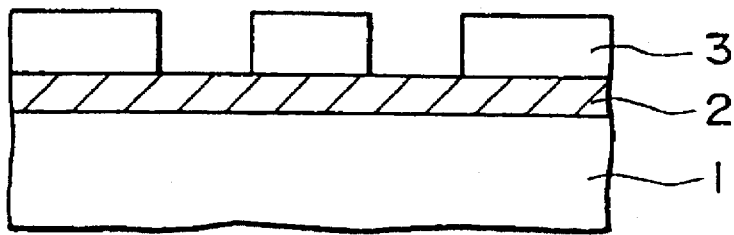

Prior to the description of the preferred embodiments, the function of the present invention will be described below.

The present invention provides a polishing slurry used for a process of polishing a workpiece by bringing the workpiece in sliding-contact with a polishing plate supplied with the slurry, and a polishing process using the slurry.

The slurry includes polishing particles treated with a surface finishing agent having at least a carboxyl group containing material, an amino group containing material, and a sulfonic acid group containing material.

Specific examples of the above carboxyl group containing materials include an hydroxycarboxylic acid such as tartaric acid, citric acid or malic acid; an amino carboxylic acid such as nitrilotriacetic acid, uranlydiacetic acid, or iminodiacetic acid; and a polycarboxylic acid such as benzenetricarboxylic acid, maleic acid or isophtalic acid.

Specific example of the above sulfonic acid group containing materials include an alkylsulfonic acid such as ethyldisufonic acid, or butyldisulfonic acid; and a phenylsulfonic acid such as phenyldisulfonic acid.

Specific examples of the above amino group containing material include an alkylamine such as ethyldiamine, propyldiamine or butyldiamine; or an aromatic amine such as diaminobenzene.

As described above, the dispersibility of fine particle of an oxide is largely dependent on the surface property of the fine particles and the property of a solution in which the fine particles are dispersed, and the surface of silicon oxide used for polishing an interlayer dielectric film is covered with hydroxyl groups classified into acidic hydroxyl groups and basic hydroxyl groups.

The dispersibility, in a basic solution, of silicon oxide used for polishing an interlayer dielectric film increases as the surface property of silicon oxide becomes more acidic. In other word, the dispersibility, in a basic solution, of silicon oxide can be improved by modifying basic hydroxyl groups covering the surface of silicon oxide into acidic hydroxyl groups. A carboxyl group containing material, for example, hydroxycarboxylic acid may be used as a modifying agent to modify a basic surface of silicon oxide into an acidic surface thereof.

On the other hand, the dispersibility, in an acidic solution, of silicon oxide used for polishing a metal interconnection increases as the surface property of silicon oxide becomes more basic. An amino group containing material, for example, alkylamine may be used as a modifying agent to convert an acidic hydroxyl group into an amino group, thus modifying the acidic surface of silicon oxide into a basic surface thereof. In this way, the object of the present invention can be achieved by optimizing the configuration of a modifying agent in accordance with the properties of a dispersion solution and polishing fine particles.

The modifying agent, which is added in a dispersion solution, is temporarily removed from the surface of a polishing agent upon polishing; however, it is re-absorbed onto the surface of the polishing agent and is oriented as described above, as a result of which the dispersibility is not degraded.

The present invention having the above configuration is effective to suppress occurrence of scratches on the surfaces of a metal interconnection layer and an interlayer dielectric film, and to improve stability of polishing rate.

The present invention will be more clearly understood by way of the following examples.

EXAMPLE 1

In this example, a polishing slurry having polishing particles treated by a surface finishing agent containing hydroxycarbolic acid, for example, citric acid, as a carboxyl group containing material is used for polishing an interlayer dielectric film formed on a base having steps in fabrication of a semiconductor integrated circuit.

In particular, in this example, steps of an interlayer dielectric film formed on an A1 interconnection layer is planarized by chemical-mechanical polishing using the above polishing slurry. The polishing slurry was prepared as follows. Silicon oxide having a primary particle size of 10 nm and a secondary particle size of 200 nm was added to a KOH solution having pH 10.3 in a concentration of 12%. The KOH solution containing silicon oxide was added with citric acid in a concentration of 2% and mixed to thereby form the slurry suitable for polishing an interlayer dielectric film.

| Composition of Slurry | |
|---|---|
| fine particles of silicon oxide | 12 wt % |
| primary particle size: 10 nm | |
| secondary particle size: 200 nm | |
| pH of KOH | 10.3 |
| concentration of citric acid | 2.0 wt % |

Citric acid was absorbed onto basic hydroxyl groups on the surface of silicon oxide. The acidity of the surfaces of the fine particles of silicon oxide was increased by the effect of the carboxyl groups orientated on the surfaces of the fine particles. The dispersibility of silicon oxide in the basic solution was thus improved.

EXAMPLE 2

In this example, a polishing slurry having polishing particles treated with a surface finishing agent containing alkylamine, for example, butyldiamine as an amino group containing material is used for polishing an interconnection layer formed on a base having steps in fabrication of a semiconductor integrated circuit.

In particular, in this example, an interconnection layer made of tungsten, which is formed in trenches formed in an interlayer dielectric film, is polished using the above polishing slurry. The polishing slurry was prepared as follows. Silicon oxide having a primary particle size of 20 nm and a secondary particle size of 200 nm was added to a $\{K_3[Fe(CN)_6]+KH_2PO_4\}$ solution having pH 5.0 in a concentration of 12 wt %. The solution containing silicon oxide was added with butyldiamine in a concentration of 3 wt % and mixed to form the slurry suitable for polishing an interconnection layer.

| Composition of Slurry | |
|---|---|
| fine particles of silicon oxide | 12 wt % |
| primary particle size: 20 nm | |
| secondary particle size: 200 nm | |
| pH of $\{K_3[Fe(CN)_6] + KH_2PO_4\}$ solution | 5.0 |
| concentration of butyldiamine | 3% |

Butyldiamine was absorbed onto acidic hydroxyl groups on the surface of silicon oxide. The basicity of the surfaces of the fine particles of silicon oxide was increased by the effect of the amino groups orientated on the surfaces of the fine particles. The dispersibility of silicon oxide in the acidic solution was thus improved.

EXAMPLE 3

In this example, a polishing process using a polishing slurry having polishing particles treated by a surface finishing agent containing hydroxycarbolic acid as a carboxyl group containing material is applied to a step of planarizing an interlayer dielectric film formed on a base having steps by chemical-mechanical polishing in fabrication of a semiconductor integrated circuit. More specifically, the polishing slurry has fine particles of silicon oxide modified by the surface finishing agent containing citric acid.

Figure 2:
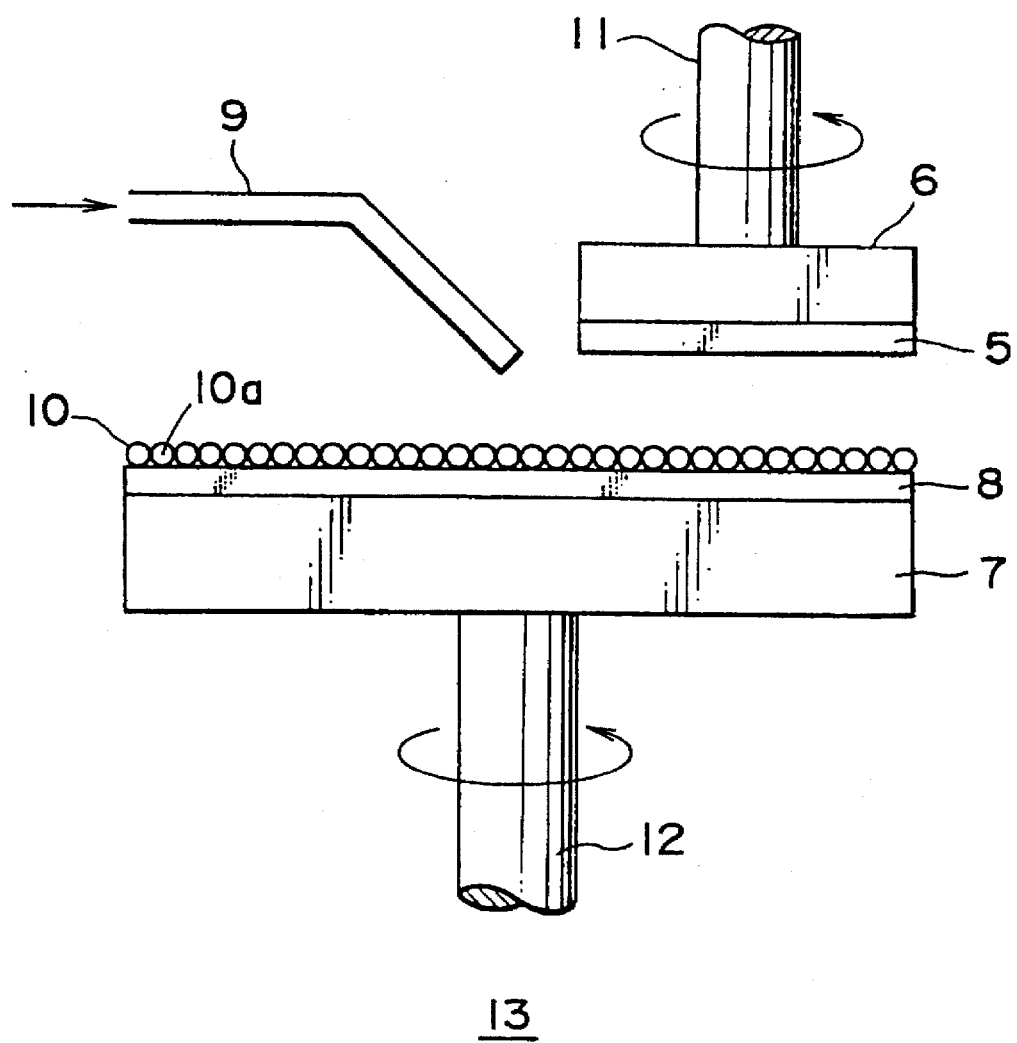
FIG. 2 is a typical view of a polishing apparatus used for the present invention.
Figure 3A:
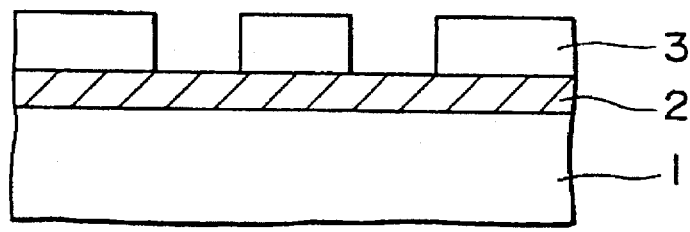
Figure 3B:
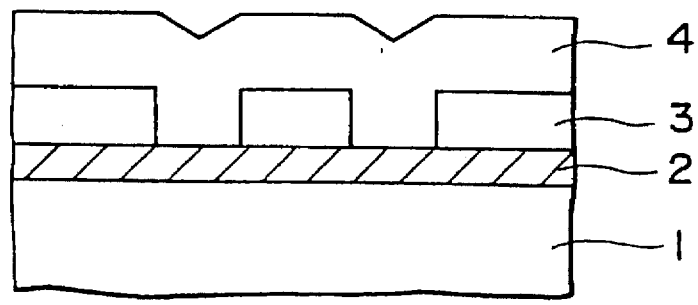
Figure 3C:
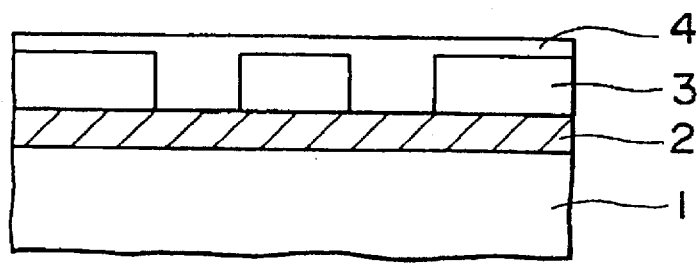

Prior to description of the actual polishing step, the configuration of a polishing apparatus used in the present invention will be described with reference to FIG. 2. In addition, one wafer polishing apparatus is shown in the FIG; however, the present invention is not particularly limited in terms of wafer mounting and processing manner.

A wafer 5 is fixed on a wafer holding stage 6 by vacuum attraction. On the other hand, a polishing cloth (pad) 8 is fixed on a polishing plate 7. A slurry 10 containing polishing particles 10a is supplied to the polishing pad 8 from a slurry pipe 9. The uniformity of polishing rate within a wafer plane is kept during polishing by rotating an upper rotating shaft 11 for the wafer holding stage 6 and a lower rotating shaft 12 for the polishing plate 7. In addition, a pressure applied to the wafer is adjusted during polishing by control of a force applied to the wafer holding stage 6.

Figure 1B:
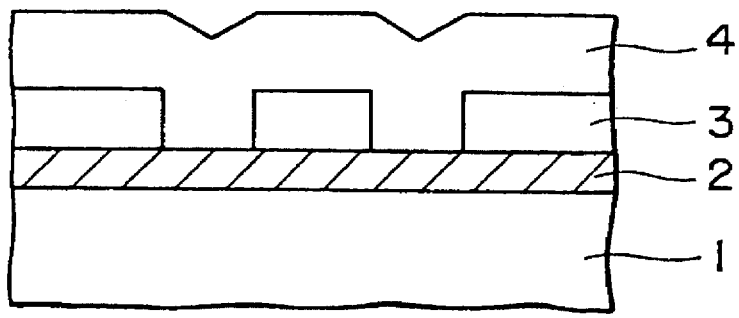

An interlayer dielectric film 2 made of silicon oxide and an Al interconnection layer 3 were formed on a semiconductor base 1 made of silicon as shown in FIG. 1A, and the Al interconnection layer 3 was patterned by photolithography and reactive ion etching (RIE). Next, as shown in FIG. 1B, a silicon oxide film was formed in the following condition, to form an interlayer dielectric film 4 over the entire surface of the wafer. Formation Condition of Interlayer Dielectric Film 4

|  | source gas | TEOS = | 800 (sccm) |
|---|---|---|---|
|  |  | $O_2$ = | 600 (sccm) |
|  |  | pressure = | 1330 (Pa) |
|  |  | temperature = | 400° C. |
|  |  | RF output = | 700 W |

After that, the wafer was held on the wafer holding stage 6 of the polishing apparatus for removing, by polishing, projections of the silicon oxide film (interlayer dielectric film) 4 thus formed. The objective surface of the wafer was then polished by the above-described polishing apparatus.

Figure 1C:
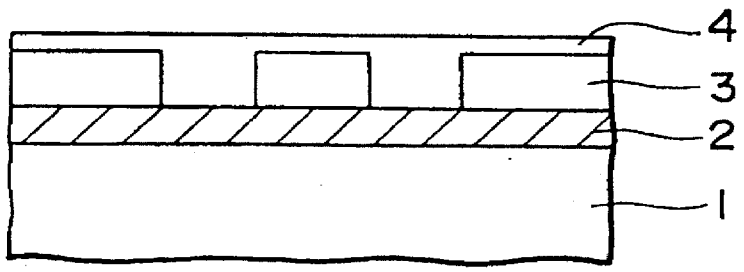

The projections of the silicon oxide film 4 were removed as shown in FIG. 1C. The surface of the interlayer dielectric film 4 was not roughened even when the slurry was removed using an HF solution.

In this way, the wafer was polished, and the silicon oxide film (interlayer dielectric film) 4 was planarized.

While the preferred examples of the present invention have been described using specific terms, such description is for illustrative purposes only, and it is to be understood that changes and variations may be made without departing from the spirit or scope of the following claims.

What is claimed is:

1. A polishing slurry used for a process of polishing a workpiece by bringing said workpiece in sliding-contact with a polishing plate supplied with said slurry, said slurry comprising polishing particles treated with a surface finishing agent having at least a carboxyl group containing material, an amino group containing material, and a sulfonic acid group containing material.

2. A polishing slurry according to claim 1, wherein said carboxyl group containing material in said surface finishing agent is an hydroxycarboxylic acid.

3. A polishing slurry according to claim 1, wherein said sulfonic acid group containing material in said surface finishing agent is an alkylsulfonic acid.

4. A polishing slurry according to claim 1, wherein said amino group containing material is an alkylamine.

5. A process of polishing a workpiece by bringing said workpiece in sliding-contact with a polishing plate supplied with a slurry, wherein said slurry comprises polishing particles treated with a surface finishing agent having at least a carboxyl group containing material, an amino group containing material, and a sulfonic acid group containing material.

6. A polishing process according to claim 5, wherein said carboxyl group containing material in said surface finishing agent is an hydroxycarboxylic acid.

7. A polishing process according to claim 5, wherein said sulfonic acid group containing material in said surface finishing agent is an alkylsulfonic acid.

8. A polishing method according to claim 5, wherein said amino group containing material in said surface finishing agent is an alkylamine.

* * * * *